(12) United States Patent
Walsh et al.

(10) Patent No.: US 9,378,805 B2
(45) Date of Patent: Jun. 28, 2016

(54) STABLE MEMORY SOURCE BIAS OVER TEMPERATURE AND METHOD

(71) Applicant: Medtronic, Inc.

(72) Inventors: Kevin K. Walsh, Peoria, AZ (US);
Brandon P. Scott, Glendale, AZ (US);
Larry E. Tyler, Mesa, AZ (US)

(73) Assignee: Medtronic, Inc., Minneapolis, MN (US)

( * ) Notice: Subject to any disclaimer, the term of this patent is extended or adjusted under 35 U.S.C. 154(b) by 686 days.

(21) Appl. No.: 13/663,939

(22) Filed: Oct. 30, 2012

(65) Prior Publication Data

US 2013/0170287 A1 Jul. 4, 2013

Related U.S. Application Data

(60) Provisional application No. 61/582,719, filed on Jan. 3, 2012.

(51) Int. Cl.
*G11C 11/417* (2006.01)

(52) U.S. Cl.
CPC .................... *G11C 11/417* (2013.01)

(58) Field of Classification Search
CPC .................................................. G11C 11/417
See application file for complete search history.

(56) References Cited

U.S. PATENT DOCUMENTS

| 4,184,207 | A | 1/1980 | McElroy | |
|---|---|---|---|---|
| 6,999,338 | B1 * | 2/2006 | Hirabayashi | G11C 11/413 365/154 |
| 7,227,804 | B1 * | 6/2007 | Kothandaraman et al. | 365/229 |
| 7,508,697 | B1 * | 3/2009 | Mukhopadhyay | G11C 29/02 365/154 |
| 7,684,262 | B2 | 3/2010 | Zampaglione et al. | |
| 7,692,964 | B1 | 4/2010 | Sabharwal et al. | |
| 2003/0102904 | A1 | 6/2003 | Mizuno et al. | |
| 2009/0244956 | A1 | 10/2009 | Inoue | |
| 2010/0149884 | A1 * | 6/2010 | Kumar | G11C 11/417 365/189.09 |
| 2010/0208539 | A1 | 8/2010 | Leomant et al. | |
| 2011/0292753 | A1 * | 12/2011 | Hsu | G11C 11/413 365/227 |

OTHER PUBLICATIONS

Mamidipaka et al., "Leakage Power Estimation in SRAMs", CECS Technical Report #03-32, Center for Embedded Computer Systems, University of California, Irvine, CA Sep. 1, 2003.
Qin et al., "SRAM Leakage Suppression by Minimizing Standby Supply Voltage", Power Point Presentation, Berkley Wireless Research Center, ISQED 2004, pp. 1-19.
(PCT/US2013/020004) PCT Notification of Transmittal of the International Search Report and the Written Opinion of the International Searching Authority, Mailed May 21, 2013, 10 pages.

* cited by examiner

*Primary Examiner* — Khamdan Alrobaie
(74) *Attorney, Agent, or Firm* — Evans M. Mburu

(57) ABSTRACT

Random access memory having a plurality of memory cells, each of the plurality of memory cells having a memory element and a first electrical characteristic being variable based, at least in part, on temperature and a bias circuit operatively coupled to at least one of the plurality of memory cells, the bias circuit being configured to generate a bias voltage for the at least one of the plurality of memory cells. The bias circuit has a second electrical characteristic being variable based, at least in part, on temperature. The first electrical characteristic is approximately proportional to the second electrical characteristic over a predetermined range of temperatures, the predetermined range of temperatures being greater than zero. The bias voltage on each of the plurality of memory cells is approximately proportional with variations in the first electrical characteristic over the predetermined range of temperatures.

67 Claims, 15 Drawing Sheets

STABLE MEMORY SOURCE BIAS OVER TEMPERATURE AND METHOD

FIELD

The present invention relates generally to memory arrays and, in particular, to systems and methods for reducing leakage current using source biasing.

BACKGROUND

Random access memory, or RAM as it is known in the art, provides short-term storage for digital electronic data. Most forms of RAM known in the art are volatile memory and, as such, require effectively constant application of power to maintain the information contained within the memory. Volatile memory stands in contrast with non-volatile memory, such as read-only memory, or ROM, which does not require constant application of power in order to maintain the data stored within the memory.

Static random access memory, or SRAM, is a particular type of RAM and is well known in the art. As with many common forms of RAM, SRAM utilizes arrangements of semiconductors to store digital information. While SRAM requires an essentially constant power source in order to maintain the digital information, SRAM contrasts with dynamic random access memory, or DRAM, in that SRAM effectively maintains data in the SRAM for as long as power is maintained to the SRAM and does not require stored digital data to be periodically refreshed.

While SRAM is an effective and cost-effective digital memory, the need to supply power to the SRAM makes the SRAM costly to maintain, particularly with respect to power consumption. In general, a voltage approximately equivalent to the threshold voltage of the semiconductor transistors utilized in the SRAM needs to be maintained to the SRAM to maintain the integrity of the data. Because the electrical characteristics of a SRAM array, in particular semiconductors, and in various cases transistors, may tend to vary slightly owing to variations in manufacturing processes, the voltage requirements to maintain data stored in the SRAM may vary among different SRAM cells.

Furthermore, the threshold voltage of the semiconductors may vary depending on the temperature of the semiconductor. In certain circumstances, as temperature of transistors of an SRAM array increases, leakage current of the transistors of the SRAM array may increase, resulting in a decrease in a minimum supply voltage which may maintain data in the SRAM array. Conversely, reductions in transistor temperature may lessen leakage current and increase minimum supply voltages which may retain data stored in the SRAM array.

As a result, under certain circumstances, the voltage, and consequently the power consumption, required to reliably maintain the data in the SRAM array may be higher than what is required by most of the SRAM cells in the SRAM array. The voltage applied to the SRAM array to provide reliability may be, in various embodiments, the voltage which is needed to maintain the data in the one SRAM cell in the SRAM array which has the highest voltage threshold. In applications such as implantable medical devices, where increased power consumption may result in decreased longevity for the implantable medical device and increased requirements for surgical procedures, such increased power consumption may be highly undesirable.

U.S. Pat. No. 7,684,262, Zampaglione et al, discloses an SRAM leakage reduction circuit. A circuit can maintain a virtual ground node at a virtual ground reference voltage of $V_{dd}-(1.5*V_{th})$, or maintain $1.5*V_{th}$ across the memory cells, where $V_{th}$ is a threshold voltage of an SRAM memory cell transistor and $V_{dd}$ is a positive supply voltage. By tracking the $V_{th}$ of the memory cell transistors in the SRAM array, the circuit reduces leakage current while maintaining data integrity. The circuitry controls the virtual ground node VG based on a memory transistor threshold voltage in order to safely keep the memory cell data under all process conditions.

SUMMARY

But while it is known in the art to directly monitor the threshold voltage of transistors in the SRAM and directly adjust a virtual ground at the SRAM, such systems incorporate active monitoring of the threshold voltage and active adjustment of the virtual ground node. Doing so is understood in the art to be directed towards improving process yields. However, active circuitry to adjust and maintain the virtual ground node comes at the cost of increased power consumption by the control system used to monitor and adjust the threshold. In environments where power consumption is of greater concern than manufacturing yields, such as in an implantable medical device, such a trade-off may not be advantageous, while an embodiment providing lower power consumption at the expense of lower manufacturing yields may be preferable.

An SRAM has been developed for effective use over temperature ranges typically found in implantable medical device applications. The SRAM as implemented may produce relatively low leakage currents. Biasing is provided by one of various methods, including by biasing a source node of the SRAM cell, by biasing the supply node of the SRAM cell, or by biasing both the source and the supply nodes. Source biasing may be achieved by inducing a biasing current at an SRAM source node. Similarly, supply biasing may be achieved by inducing a biasing current at an SRAM supply node. Both such biases may be generated by semiconductors with related properties to the semiconductors of the SRAM array, resulting in automatic variation of the bias generated by the bias circuit proportional to the variation of the data retention voltage of the SRAM array. By inducing a current or voltage at a source node or supply node, active circuitry for monitoring threshold voltages and maintaining a virtual ground may be dispensed with, thereby saving power. Moreover, the electronic componentry which generates the biasing current may advantageously inherently provide automatic compensation for variations in the threshold voltage of the SRAM caused by temperature changes.

An SRAM which incorporates such biasing, either source biasing, supply biasing or both together, may improve reliability while reducing power consumption. Improvements in reliability may account for the impact that variation in temperature causes in threshold voltage levels in the SRAM. For low power applications, it may be preferable to do so while reducing or minimizing overhead power consumption relative to what is known in the art.

In an embodiment, a random access memory has a plurality of memory cells, each of the plurality of memory cells having a memory element and a first electrical characteristic being variable based, at least in part, on temperature and a bias circuit operatively coupled to at least one of the plurality of memory cells, the bias circuit being configured to generate a bias voltage for the at least one of the plurality of memory cells. The bias circuit has a second electrical characteristic being variable based, at least in part, on temperature. The first electrical characteristic is approximately proportional to the second electrical characteristic over a predetermined range of temperatures, the predetermined range of temperatures being greater than zero. The bias voltage on each of the plurality of memory cells is approximately proportional with variations in the first electrical characteristic over the predetermined range of temperatures.

In an embodiment, the bias circuit is a source bias circuit.

In an embodiment, the random access memory further has a supply bias circuit operatively coupled to the at least one of the plurality of memory cells, the supply bias circuit being configured to generate a bias voltage for at least one of the plurality of memory cells, the supply bias circuit having the second electrical characteristic being variable based, at least in part, on temperature.

In an embodiment, the bias circuit is a supply bias circuit.

In an embodiment, the random access memory further comprises a voltage buffer operatively coupled between the supply bias circuit and the at least one of the plurality of memory cells.

In an embodiment, the voltage buffer comprises an input and an output configured to supply the bias voltage, the input being coupled to the supply bias circuit and the output being coupled to the at least one of the plurality of memory cells. Another one of the plurality of memory cells is coupled to the input of the voltage buffer and configured to supply, in combination with the supply bias circuit, an input voltage related to the bias voltage to the input to the voltage buffer.

In an embodiment, the random access memory further comprises a plurality of the bias circuits.

In an embodiment, wherein each of the plurality of bias circuits comprise a bias element with the bias element having the second electrical characteristic being variable based, at least in part, on temperature.

In an embodiment, the random access memory further has a plurality of the bias circuits.

In an embodiment, each of the plurality of bias circuits comprise a bias element with the bias element having the second electrical characteristic being variable based, at least in part, on temperature.

In an embodiment, each one of the plurality of bias circuits corresponds to exactly one of the plurality of memory cells.

In an embodiment, the bias element of each of the bias circuits comprises metal oxide semiconductor transistors.

In an embodiment, the bias element of each of the plurality of bias circuits comprises P-channel metal oxide semiconductor transistors.

In an embodiment, the random access memory is operatively coupled to a power source, wherein each memory element of the plurality of memory cells comprises a P-channel metal oxide semiconductor transistor having a body and wherein the body the P-channel metal oxide semiconductor transistor of at least one of the plurality of memory cells is operatively coupled to the power source.

In an embodiment, the random access memory is operatively coupled to a reference ground, wherein each memory element of the plurality of memory cells comprises an N-channel metal oxide semiconductor transistor having a body and wherein the body of the N-channel metal oxide semiconductor transistor of the at least one of the plurality of memory cells is operatively coupled to the reference ground.

In an embodiment, each memory element of the plurality of memory cells comprises a P-channel metal oxide semiconductor transistor having a body and wherein the body of the P-channel metal oxide semiconductor transistor of at least one of the plurality of memory cells is biased by the bias voltage of the bias element.

In an embodiment, the random access memory is operatively coupled to a reference ground, wherein each memory element of the plurality of memory cells comprises an N-channel metal oxide semiconductor transistor having a body and wherein the body of the N-channel metal oxide semiconductor transistor of the at least one of the plurality of memory cells is operatively coupled to the reference ground.

In an embodiment, the bias element of each of the plurality of bias circuits comprise N-channel metal oxide semiconductor transistors.

In an embodiment, the random access memory is operatively coupled to a reference ground, wherein each memory element of the plurality of memory cells comprises an N-channel metal oxide semiconductor transistor having a body and wherein the body of the N-channel metal oxide semiconductor transistor of at least one of the plurality of memory cells is operatively coupled to the reference ground.

In an embodiment, each memory element of the plurality of memory cells comprises an N-channel metal oxide semiconductor transistor having a body and wherein the body of the N-channel metal oxide semiconductor transistors of at least one of the plurality of memory cells is biased by the bias voltage of the bias element.

In an embodiment, each of the plurality of bias circuits comprises a current mirror, the bias element being a component of the current mirror.

In an embodiment, the memory element of each of the plurality of memory cells has a source node and a power node, the bias circuit being operatively coupled between the power node and the power source.

In an embodiment, the bias circuit is a first bias circuit, and a second bias circuit is operatively coupled between the source node and the reference node.

In an embodiment, the random access memory further comprises a supply bias voltage buffer operatively coupled between the first bias circuit and the supply node and a source bias voltage buffer operatively coupled between the second bias circuit and the source node.

In an embodiment, the memory element of each of the plurality of memory cells has a source node and a power node, the power node being coupled to the power source and the bias circuit being operatively coupled between the source node and the reference node.

In an embodiment, the current mirror comprises the bias element and a current element operatively coupled to the bias element, a current source induces a current through the current element, and a bias current is induced through the bias element and the memory element approximately equivalent to the current and whereby the bias voltage on each source node of the plurality of memory cells is properly maintained.

In an embodiment, each of the plurality of memory cells has a read mode and a storage mode, wherein the bias current is induced through the bias element when the memory cell is in the storage mode and wherein the bias current is not induced through the bias element when the memory cell is in the read mode.

In an embodiment, each of the plurality of memory cells also has a write mode, wherein the bias current is not induced through the bias element when the memory cell is in the write mode.

In an embodiment, the first electrical characteristic is a threshold voltage and wherein a current generated by the bias circuit induces the bias voltage based, at least in part, on the supply voltage and the threshold voltage.

In an embodiment, the threshold voltage is inversely variable to variation in the temperature.

In an embodiment, the bias voltage is based, at least in part, on the supply voltage less the threshold voltage less a voltage margin.

In an embodiment, the bias voltage maintains the digital bit in at least one of the plurality of memory cells.

In an embodiment, the bias circuit generates the bias voltage for more than one of the plurality of memory cells.

In an embodiment, the bias circuit generates the bias voltage for all of the plurality of memory cells.

In an embodiment, the bias circuit comprises at least one of the plurality of memory cells.

In an embodiment, method of maintaining a relatively stable bias voltage of a random access memory over a range of temperatures has the steps of providing a plurality of memory cells each having a memory element, each of the plurality of memory cells being configured to store a digital bit and having a first electrical characteristic being variable based, at least in part, on temperature and providing a bias circuit operatively coupled to at least one of the plurality of memory cells and being configured to bias the at least one of the plurality of memory cells. The bias circuit having a second electrical characteristic being variable based, at least in part, on temperature. The first electrical characteristic being approximately proportional to the second electrical characteristic over a predetermined range of temperatures. A bias voltage of at least one of the plurality of memory cells is approximately proportional with variations over the range of temperatures.

FIGURES

FIG. 4 is a response graph of the SRAM cell with current source bias of FIG. 2a;

FIGS. 8a and 8b are block diagrams of implementations of SRAM cells as in FIG. 7a;

DESCRIPTION

Figure 1:
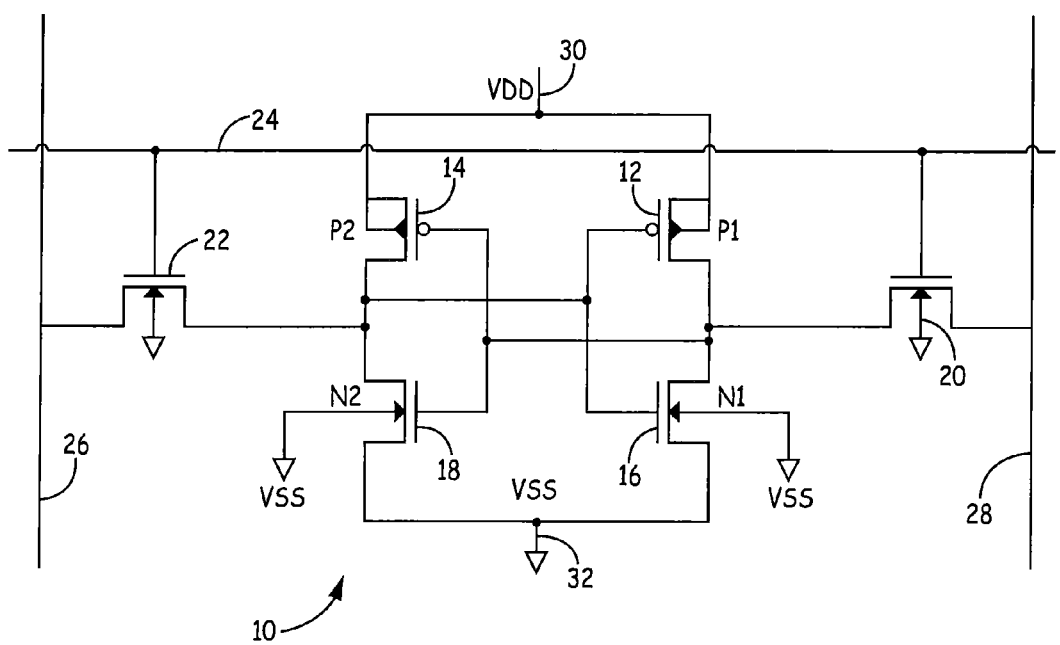
FIG. 1 is a schematic of a conventional SRAM cell.

FIG. 1 is a circuit-level diagram of a static random access memory ("SRAM") cell 10 known in the art. The structure and operation of conventional SRAM cells are well known in the art and will not be discussed in detail here. However, to facilitate the discussion of current source biasing below, the structure and operation of SRAM cell 10 will be briefly treated below.

P-channel transistors 12, 14 and N-channel transistors 16, 18 are connected as cross-coupled inverters having two stable states denotable as logical "0" or logical "1". Access transistors 20, 22 provide access to place SRAM cell 10 in a read mode and to place SRAM cell 10 in a write or storage mode from wordline 24 by enabling access to bitline 26 and not-bitline 28. Power node 30, which provides a positive supply line and is known in the art as $V_{DD}$, biases the source of each of P-channel transistors 12, 14 high, while ground 32 biases the source of N-channel transistors 16, 18 low. The voltage component of SRAM cell 10 that consumes power is thus $V_{DD}$ minus ground, or simply $V_{DD}$.

Having a relatively small value $V_{DD}$, may reduce overall power consumption of SRAM cell. However, in order to maintain transistors 12, 14, 16, 18 in an active state, the value of $V_{DD}$ generally must equal or exceed the minimum data retention voltage, or DRV, of transistors 12, 14, 16, 18. Moreover, owing to the physical structure of transistors 12, 14, 16, 18, changes in temperature may lead to variations in the threshold voltage $V_{th}$ and leakage current of transistors 12, 14, 16, 18 and, consequently, to the minimum data retention voltage DRV. In various embodiments, over a temperature range from negative twenty-five (−25) degrees Fahrenheit (−32 degrees Celsius) to positive fifty-five (55) degrees Fahrenheit (13 degrees Celsius), the minimum data retention voltage DRV, may vary by more than one hundred (100) millivolts. In an embodiment, the minimum data retention voltage DRV may vary by three hundred (300) millivolts or more. In various embodiments, relatively low temperatures may result in relatively higher threshold voltages and an increased data retention voltage DRV. Thus, in the art, in order to provide an operable SRAM over a temperature range, the SRAM is commonly configured to be operable with $V_{DD}$ at the worst case for the temperature range, thereby resulting in excessive margin over the threshold voltage when not at the extreme of the temperature range.

Figure 2A:
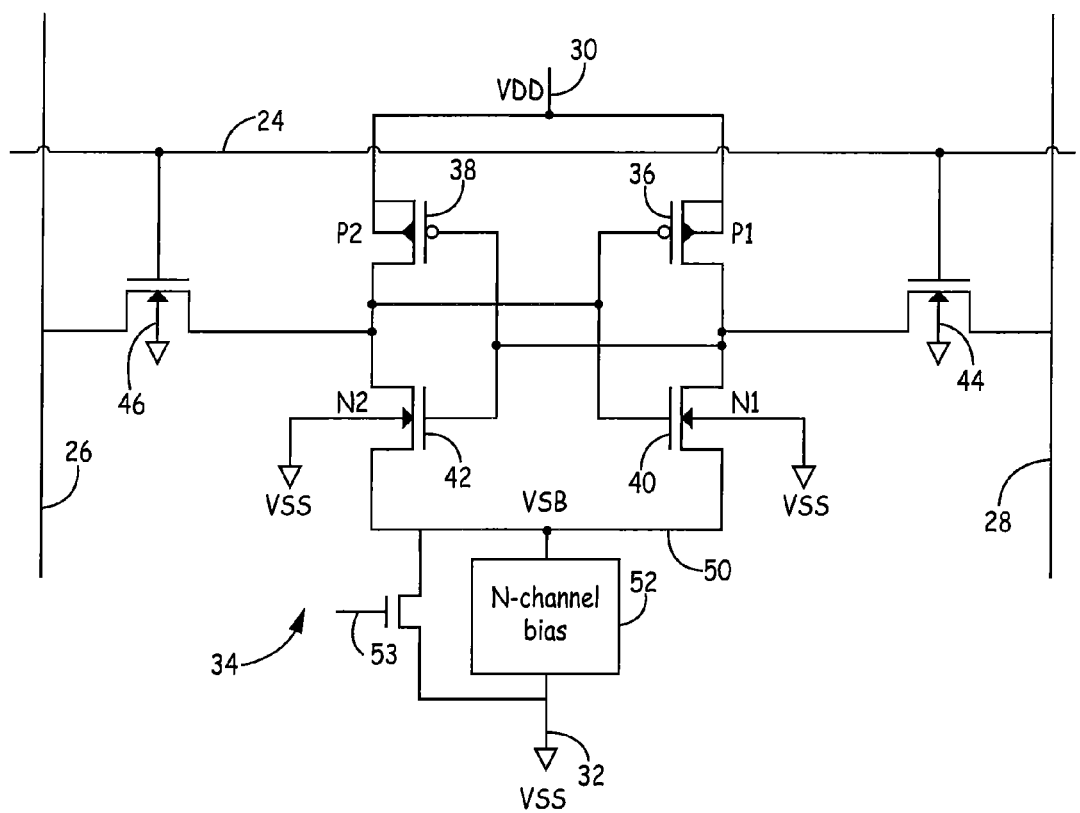
FIGS. 2a and 2b are circuit-level diagrams of source biased SRAM cells.
Figure 2B:
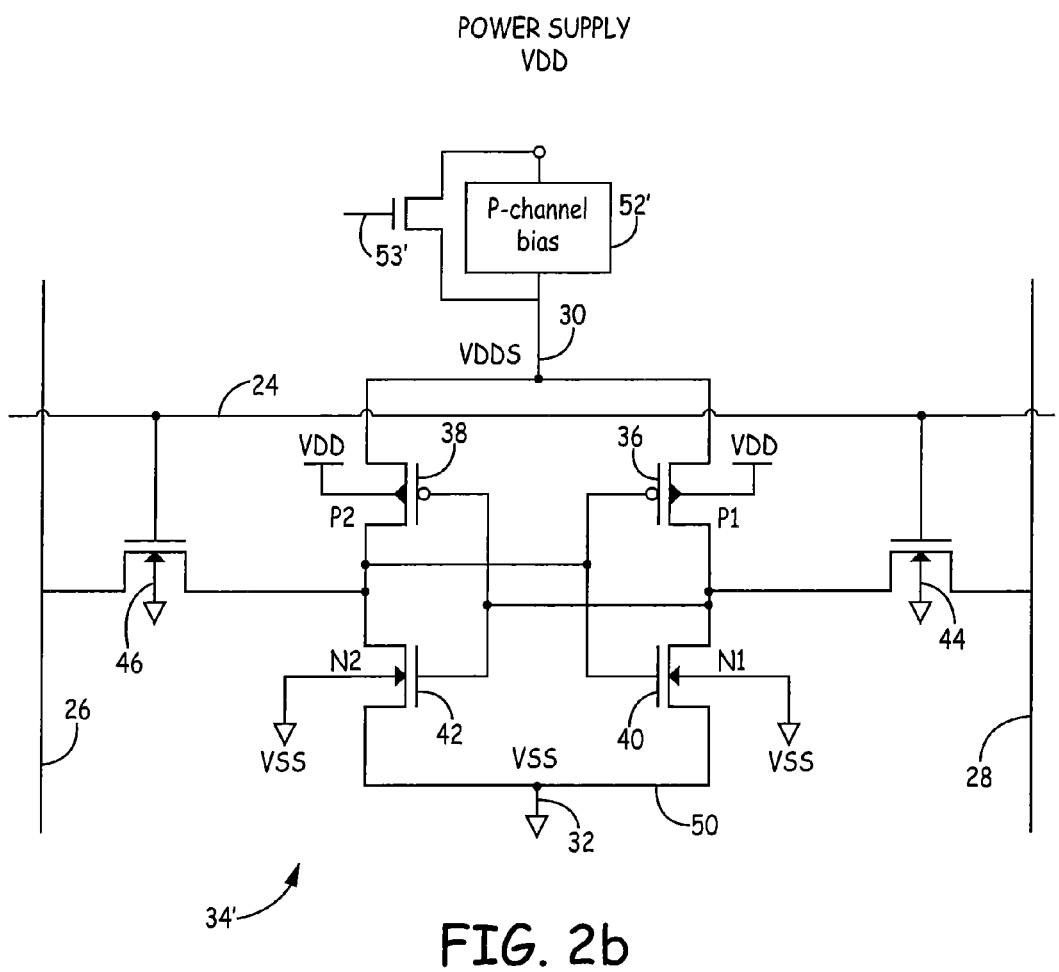

FIGS. 2a and 2b are circuit-level diagrams of source biased SRAM cells 34 and 34', respectively. SRAM cells 34 and 34' incorporate certain componentry generally similar to SRAM cell 10. P-channel metal oxide semiconductor transistors 36, 38 and N-channel metal oxide semiconductor transistors 40, 42 individually form memory elements and may be made from similar processes as equivalent transistors 12, 14, 16, 18 and are connected as cross-coupled inverters. Access transistors 44, 46 provide access to read and to write SRAM cell 34. Wordline 24, bitline 26, not-bitline 28 and power node 30 are otherwise the same as SRAM cell 10. SRAM cell 34 also incorporates ground 32. Because transistors 36, 38, 40, 42 are made from the same processes and have the same sizes, transistors 36, 38, 40, 42 may have a common electrical characteristic, such as a common threshold voltage.

In storage mode, SRAM cell 34, however, ground 32 is not directly coupled to source 50 of N-channel transistors 40, 42 unlike SRAM cell 10. Rather, with switch 53 open, source 50 acts as a virtual ground $V_{SB}$ and is coupled to N-channel source bias circuit 52. Consequently, SRAM cell 34 incorporates N-channel transistors 40, 42 with biased source nodes, resulting, as will be disclosed in detail below, in inherent temperature compensation. The bias voltage over each N-channel transistor 40, 42 may be defined as the difference between $V_{ss}$ ground on the body of N-channel transistors 40, 42 and the voltage of virtual ground $V_{SB}$. In read/write mode, switch 53 is closed, essentially removing N-channel bias 52 from the circuit enabling uninhibited read/write operations without the interference of N-channel bias 52.

Relatedly, in storage mode, power node 30 of SRAM cell 34' functions as a virtual power node and is coupled to P-channel bias circuit 52'. The bodies of P-channel transistors 36, 38 are coupled to $V_{DD}$. Consequently, SRAM cell 34 incorporates P-channel transistors 36, 38 with biased source nodes, resulting, as will be disclosed in detail below, in inherent temperature compensation. The bias voltage over each P-channel transistor 36, 38 may be defined as the difference between $V_{DD}$ power voltage on the body of P-channel transistors 36, 38 and the voltage of virtual power node 30. In read/write mode, switch 53' is closed, essentially removing P-channel bias 52' from the circuit enabling uninhibited read/write operations without the interference of P-channel bias 52'.

Figure 3A:
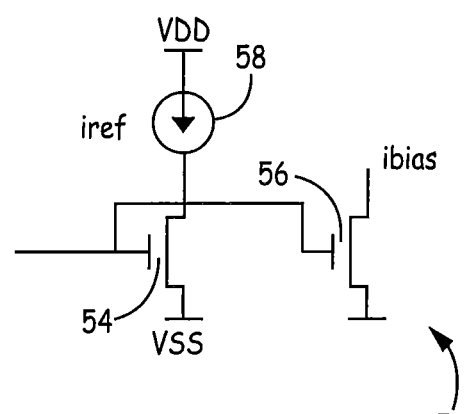
FIGS. 3a and 3b are embodiments of bias circuits.
Figure 3B:
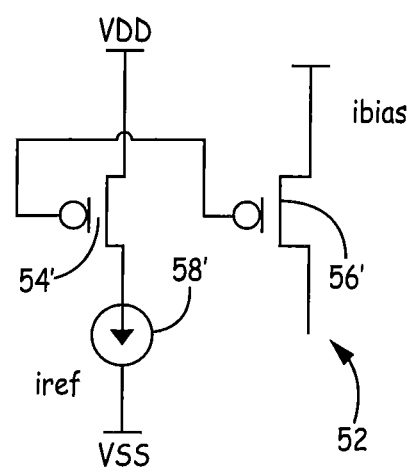

FIGS. 3a and 3b are exemplary embodiments of potential bias circuits which may be utilized, including N-channel bias circuit 52 and P-channel bias circuit 52', respectively. In various embodiments disclosed herein, N-channel bias circuit 52 may be utilized as a source bias circuit and a ground bias circuit. In various embodiments disclosed herein, P-channel bias circuit 52' may be utilized as a source bias circuit and a supply bias circuit. In the exemplary embodiment, N-channel bias circuit 52 is a current mirror. As shown, the current mirror is configured as known in the art, with N-channel transistor 54 sized relative to N-channel transistor 56 to provide bias elements to induce a desired sink current through transistors 40, 42 (FIG. 2a) to ground. Transistor 54 is diode coupled with the gate and drain shorted and coupled to current source 58. The gates of transistors 54 and 56 are likewise shorted, the drain of transistor 56 is connected to the sources of transistors 40, 42 and the sources of transistors 54, 56 are shorted to ground. Alternatively, variations on, or supplements to current mirror 52 as known in the art may be incorporated to provide current $L_{bias}$.

P-channel bias 52' operates on related principles to N-channel bias 52, adjusted to account for P-channel components 54', 56' to provide bias elements induce a bias current to power node 30 and P-channel transistors 36, 38 coupled thereto. As with N-channel bias 52, in the exemplary embodiment P-channel bias 52' is a current mirror formed from P-channel transistors 54', 56' and configured to mirror $I_{ref}$ from current source 58' to $I_{bias}$ over power node 30. As with N-channel bias 52, variations on, or supplements to current mirror 52' as known in the art may be incorporated to provide current $I_{bias}$.

As is known in the art, the configuration of current mirror 52 causes a current through transistor 54 to be induced proportionally in transistor 56, which acts as the biasing element for memory cell 34. Thus, passing the output $I_{ref}$ of a current element such as current source 58 through current transistor 54 induces current $I_{bias}$ in current bias transistor 56. Because current $I_{bias}$ is pulled through transistor 56, a voltage drop occurs from drain to source over transistor 56 proportional to the electrical characteristic, in an embodiment the voltage minimum data retention voltage, of transistors 40, 42. Current $I_{ref}$ is selected and transistors 54 and 56 are sized so that current $I_{bias}$ through transistor 56 is generated such that the desired leakage current for cell 34 is obtained while maintaining a desired data retention voltage for cell 34. The data retention voltage may be maintained over the range of operating temperatures. In various embodiments, current $I_{bias}$ may be generated for more than one cell 34 from a single current mirror 52. In various embodiments, each current mirror 52 is configured to supply current $I_{bias}$ for approximately 128,000 SRAM cells 34 or for approximately 256,000 SRAM cells 34, though more or fewer SRAM cells 34 are contemplated per current mirror 52. In various embodiments, current $I_{bias}$ is from approximately fifty (50) nanoAmperes to one hundred (100) nanoAmperes.

As discussed above, data retention voltage DRV of a cell 34 varies according to temperature. As further discussed above, variations in temperature in transistors 36, 38, 40, 42 may change the threshold voltage of the transistors, potentially taking SRAM cell 34 outside of active operational range if available power voltage $V_{DD}$ is not sufficiently large and source node 50 is not directly coupled to ground.

A function of current biasing source node 50 using current mirror 52 is to induce a voltage at source node 50 that reduces leakage in comparison with SRAM cell 10 while maintaining a sufficient voltage across SRAM cell 34 to retain data in SRAM cell 34 across a range of temperatures. The voltage induced at source node 50 increases the bulk to source voltage of N-channel transistors 40, 42, thereby lowering the effective leakage current of N-channel transistors 40, 42. Because of the known proportionality between N-channel transistors 40, 42 and bias transistors 54, 56, as the temperature of cell 34 varies, source node voltage 50 may tend to vary proportionally and automatically as an inherent effect of the temperature on transistors 40, 42, 54, 56. As temperature is reduced, leakage from cell 34 is reduced while concurrently the voltage of source node 50 is reduced owing to a drain to source voltage of transistor 56 in current mirror 52 inherently and automatically adjusting to track proportionally with the drain to source voltage of transistor 54 in current mirror 52. The reduction of the voltage of source node 50 increases the effective supply voltage across cell 34, thereby enabling cell 34 to retain data at the lower temperature in spite of the increased threshold voltages $V_{th}$ of transistors 40, 42, 54, 56 which results from the lower temperature. Conversely, as temperature of cell 34 increases, leakage from cell 34 increases owing to the resultant increase in source biasing on node 50 from current $I_2$ generated by current mirror 52.

It is noted that source biasing SRAM cell 34 provides for improved ability of SRAM cell 34 to retain data in a state with a low leakage current. Consequently, in various embodiments, SRAM cell 34 is biased by source bias circuit 52 when SRAM cell 34 is in a storage mode. In an embodiment, current source 58 is enabled to deliver current when SRAM cell 34 is placed in storage mode. However, biasing may interfere with the ability of SRAM cell 34 to read or write information. In various embodiments, when SRAM cell 34 is placed in read or write mode, source bias circuit 52 does not bias SRAM cell 34. In an embodiment, current source 58 is disabled and does not deliver current when SRAM cell 34 is in read or write mode. In various embodiments, current source 58 is enabled when SRAM cell 34 is in storage mode and disabled when SRAM cell 34 is in read or write mode.

Figure 4:
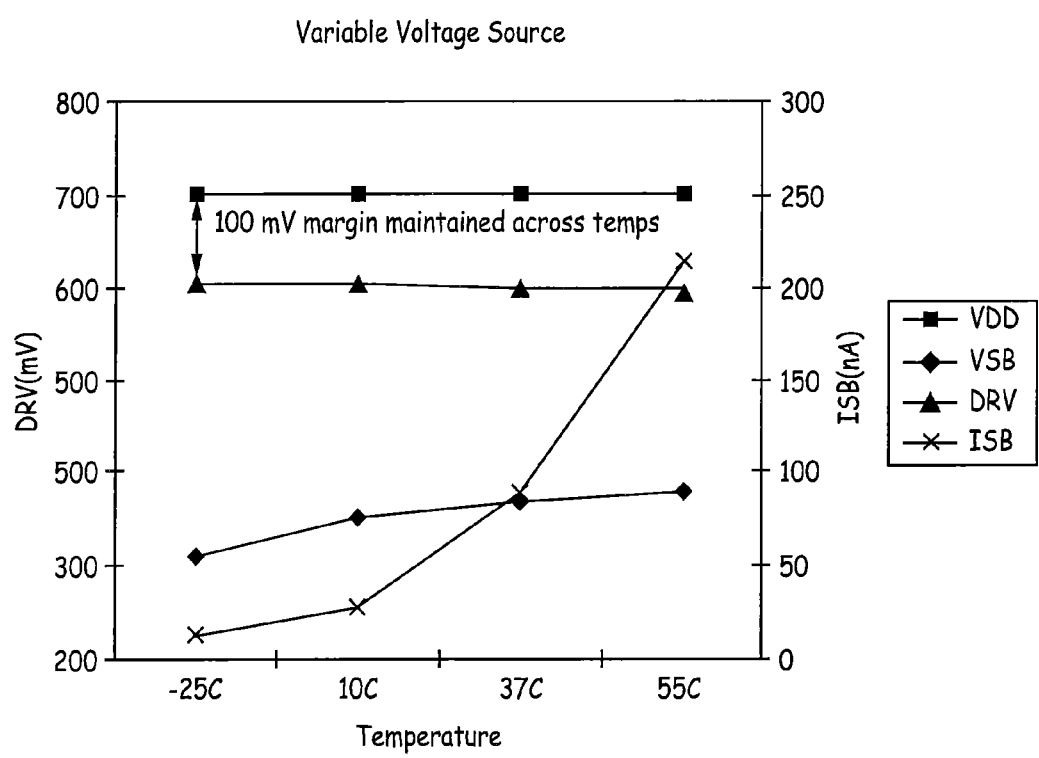

FIG. 4 is a graphical representation of response curves 60 of SRAM cell 34. Response curves 60 are plotted as a function of temperature 62 and voltage 64. As shown, power voltage $V_{DD}$ 66 remains fixed over time, as illustrated at seven hundred (700) millivolts. Source node 50 voltage $V_{SB}$ 68 and source node 50 current $I_{SB}$ 70, however, rise as temperature rises, owing at least in part to changes in the threshold voltage $V_{th}$ of transistors 36, 38, 40, 42, 54, 56. However, as discussed above, because the bias voltage on source node 50 automatically varies in relation to the increased leakage of cell 34 with respect to temperature, minimum data retention voltage DRV 72 of cell 34 remains constant at approximately six hundred (600) millivolts. Similarly as temperature is reduced, source node 50 voltage $V_{SB}$ is lowered, thereby maintaining an approximately constant data retention voltage DRV. Consequently, in an embodiment, a safety margin of approximately one hundred (100) millivolts is maintained between $V_{DD}$ and DRV over a range of temperatures. In various alternative embodiments, a safety margin of three hundred (300) millivolts or more is maintained between $V_{DD}$ and DRV.

Thus, owing to the use of current mirror 52 to current bias source node 50 of SRAM cell 34, the voltage drop over SRAM cell 34, in other words the voltage difference between $V_{DD}$ 66 and $V_{SB}$ 68 varies to provide a minimum data retention safety margin as discussed above, whatever changes may occur in the threshold voltage $V_{th}$ of transistors 36, 38, 40, 42, 54, 56. Thus, SRAM cell 34 may operate with relatively less power consumption than SRAM cell 10, which does not current bias source node 32.

Figure 5A:
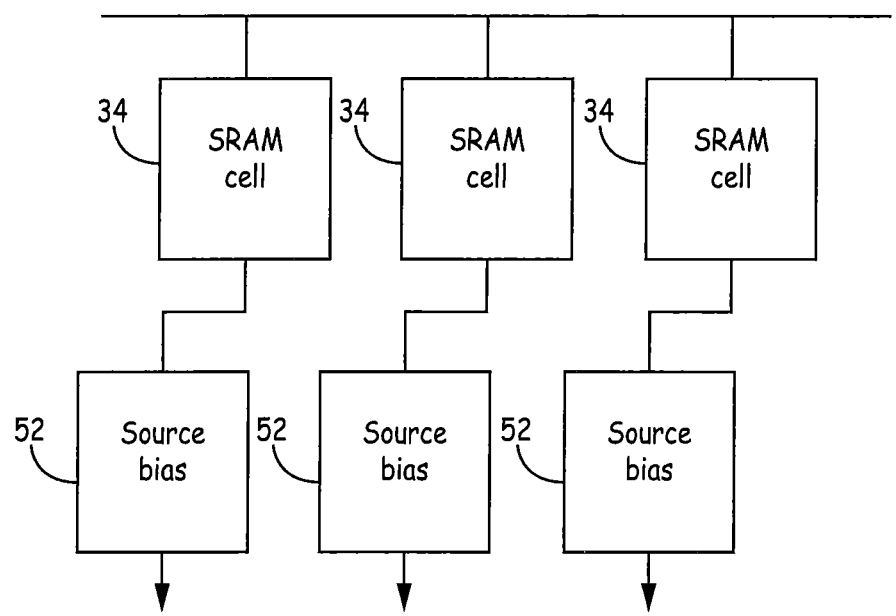
FIGS. 5a and 5b are block diagrams of implementations of an SRAM cell with current source bias circuits.
Figure 5B:
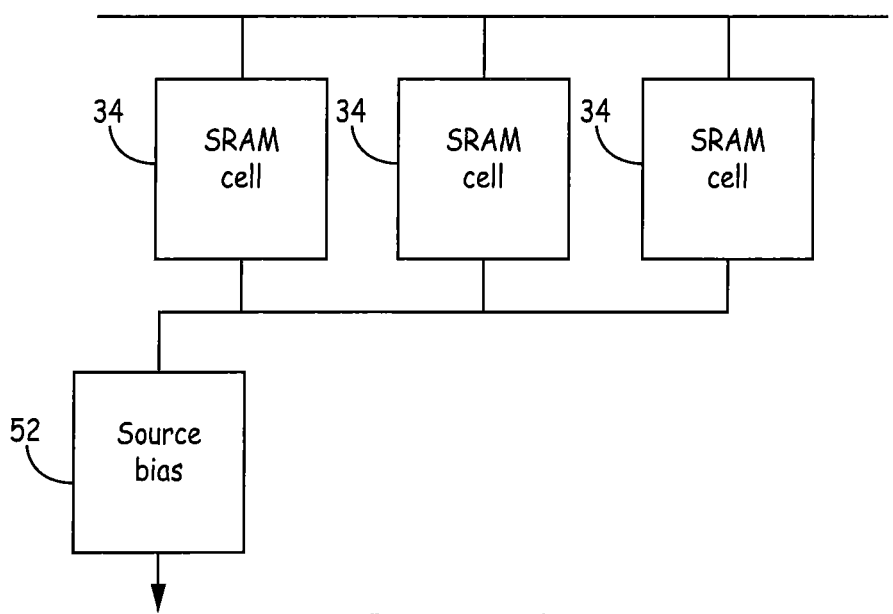

FIG. 5a is a block diagram of multiple SRAM cells 34 each being current source biased by one of multiple current mirrors 52. In an SRAM chip the number of SRAM cells 34 may be scaled to provide a memory block adequate for whatever system in which the memory block is being utilized. In an alternative embodiment, illustrated in FIG. 5b, one current mirror 52 is adequate to current source bias multiple SRAM cells 34 and is coupled to source node 50 of each SRAM cell 34.

Figure 6A:
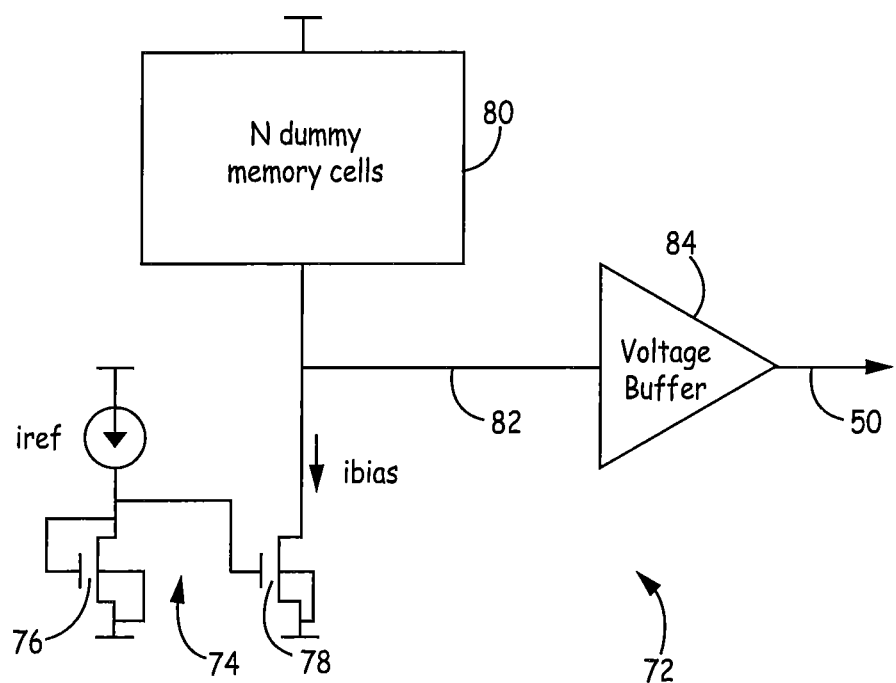
FIGS. 6a and 6b are alternative embodiments of SRAM bias circuits incorporating a voltage buffer and dummy memory cells.
Figure 6B:
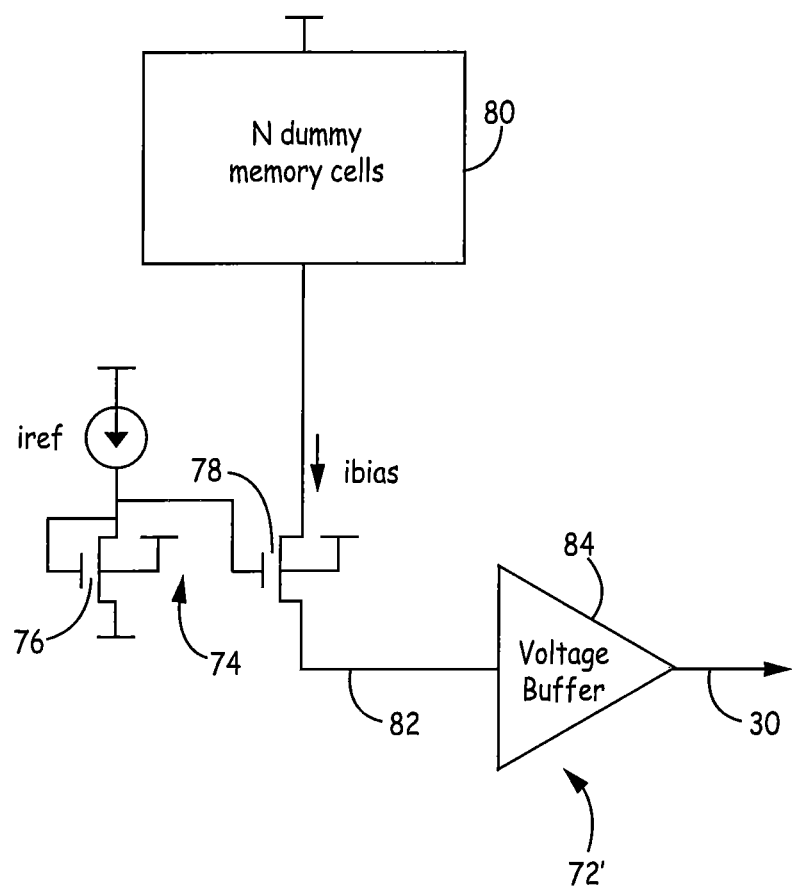

FIGS. 6a and 6b are alternative embodiments of SRAM bias circuits 72 and 72'. In contrast to source bias circuits 52, 52', which induces a bias current through SRAM cell 34, source bias circuits 72, 72' induce a bias voltage at source node 50 and power node 30, respectively. Current mirrors 74, 74' are related to current mirrors 52, 52', respectively, including transistors 76, 78 which use source current $L_{ref}$ to generate bias current $I_{bias}$. However, unlike source bias circuits 52, 52', source bias circuits 72, 72' further include at least one dummy memory cell 80. In an embodiment, dummy memory cell 80 is electrically the same as memory cell 34 but, rather than being configured to store data, instead functions as a dummy memory cell in order to produce a voltage on input 82 of voltage buffer 84. Buffer 84 then produces the bias voltage on source node 50 or supply node 30, as appropriate, in order to bias memory cell 34.

In various embodiments, memory cell 80 incorporates multiple dummy memory cells 34. In various embodiments, dummy memory cell 80 incorporates from ten (10) to one thousand (1000) memory cells 34. In various embodiments, memory cell 80 is a functioning memory array configured to store data. In various embodiments, the dimensions of transistors 76, 78 are selected so that source current $I_{ref}$ is in a range of one (1) to one thousand (1000) times greater than bias current $I_{bias}$.

Figure 7A:
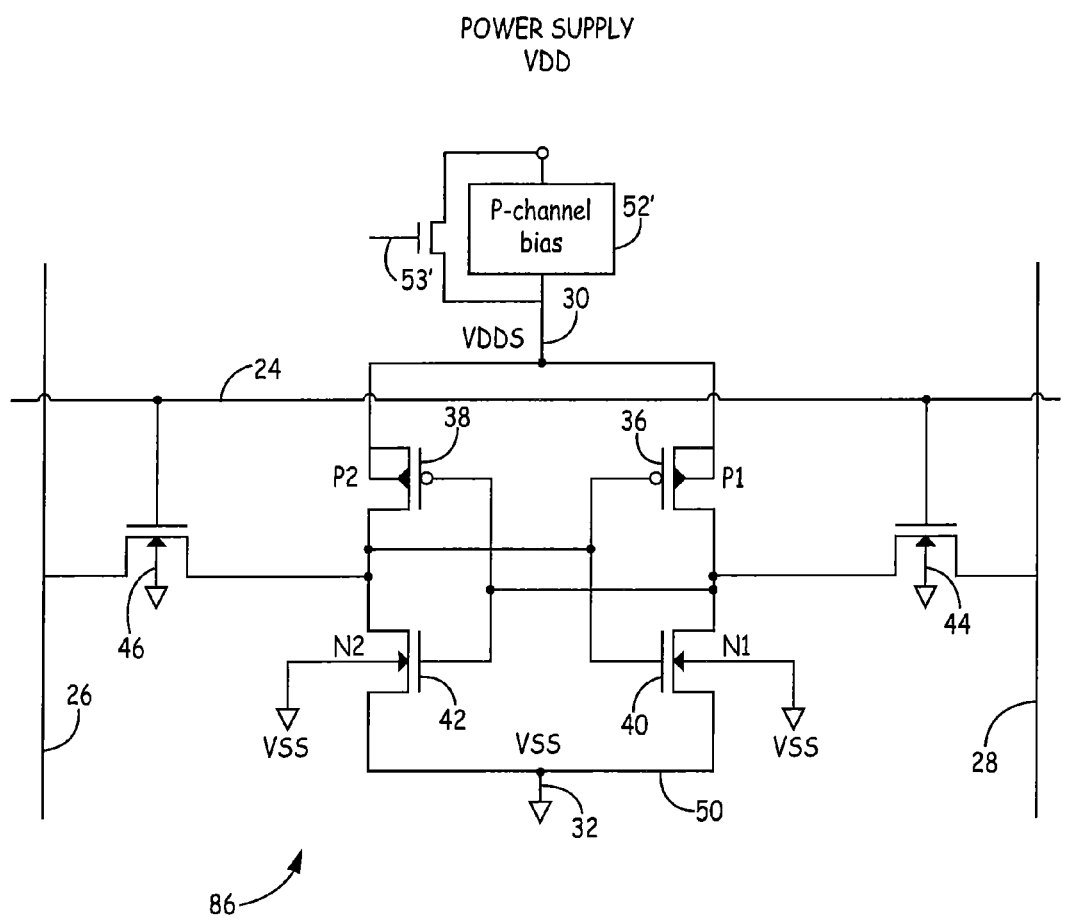
FIG. 7a is a SRAM cell.

FIG. 7a is a SRAM cell 86. SRAM cell 86 is similar to SRAM cell 34 and 34', respectively, (FIGS. 2a and 2b) in that both include an SRAM cell related to that of SRAM cell 10 as well as a bias circuit 52, 52'. However, with respect to FIG. 7a, in storage mode with switch 53' open, SRAM cell 86 incorporates bias circuit 52' as a supply bias with the bodies of P-channel transistors 36, 38 tied to virtual supply $V_{DDS}$. Consequently, supply bias circuit 52' creates a virtual supply $V_{DDS}$ which varies with respect to the threshold voltage. In read/write mode, switch 53' is closed effectively removing P-channel bias 52' from the circuit enabling uninhibited read/write functionality.

As illustrated, apart from tying the bodies of transistors 36, 38, 40, 42 variably to virtual supply $V_{DDS}$ and virtual ground $V_{SB}$ as appropriate, SRAM cells 86, 86' are otherwise similar to SRAM cells 34, 34'. Access transistors 44, 46 provide access to read and to write SRAM cell 34. Wordline 24, bitline 26, not-bitline 28 provide reading and writing capabilities. It is recognized, however, that SRAM cells 86 and 86' with transistor bodies tied to virtual supply $V_{DDS}$ and virtual ground $V_{SB}$, as appropriate, may vary in terms of its components from those of SRAM cells 34 and 34' based on the particular circumstances in which the SRAM cells 86, 86' are implemented.

Figure 8A:
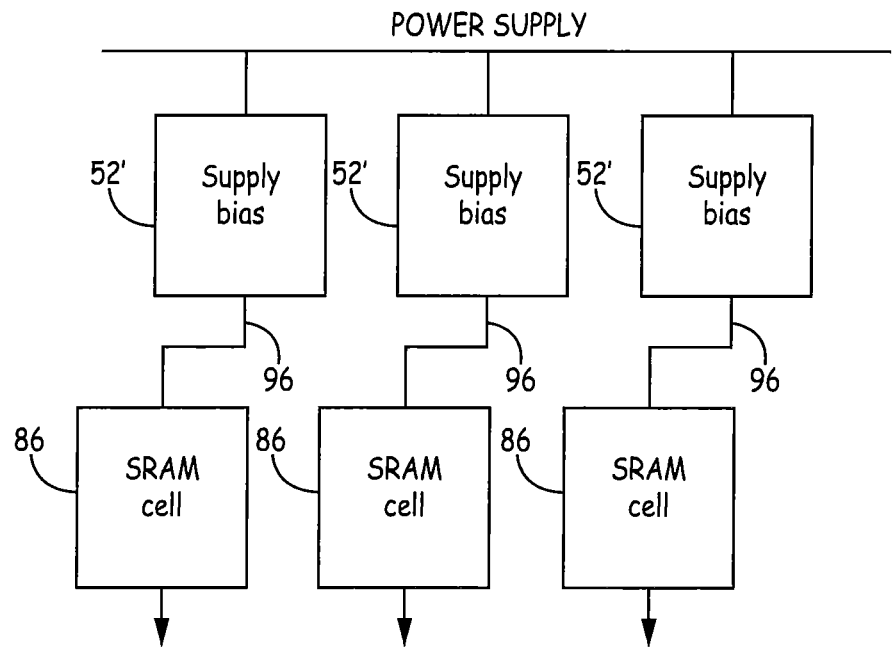
Figure 8B:
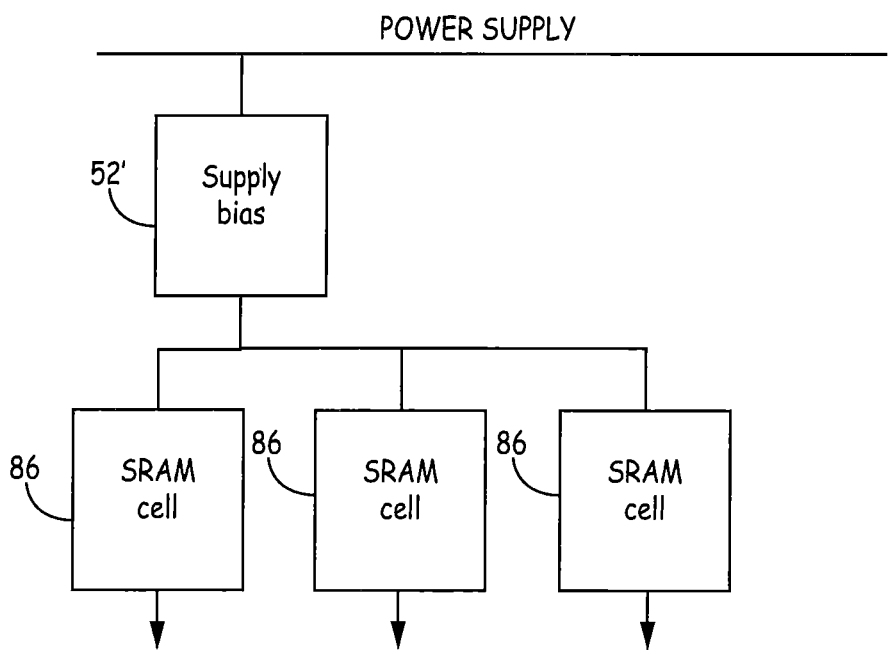

FIG. 8a is a block diagram of multiple SRAM cells 86 each being current supply biased by one of multiple P-channel biases 52', such as a current mirror. In an SRAM chip, the number of SRAM cells 86 may be scaled to provide a memory block adequate for whatever system in which the memory block is being utilized. In an alternative embodiment, illustrated in FIG. 8b, one P-channel biases 52', such as a current mirror, is adequate to current source bias multiple SRAM cells 86 and is coupled to virtual supply 96 of each SRAM cell 86.

Figure 9A:
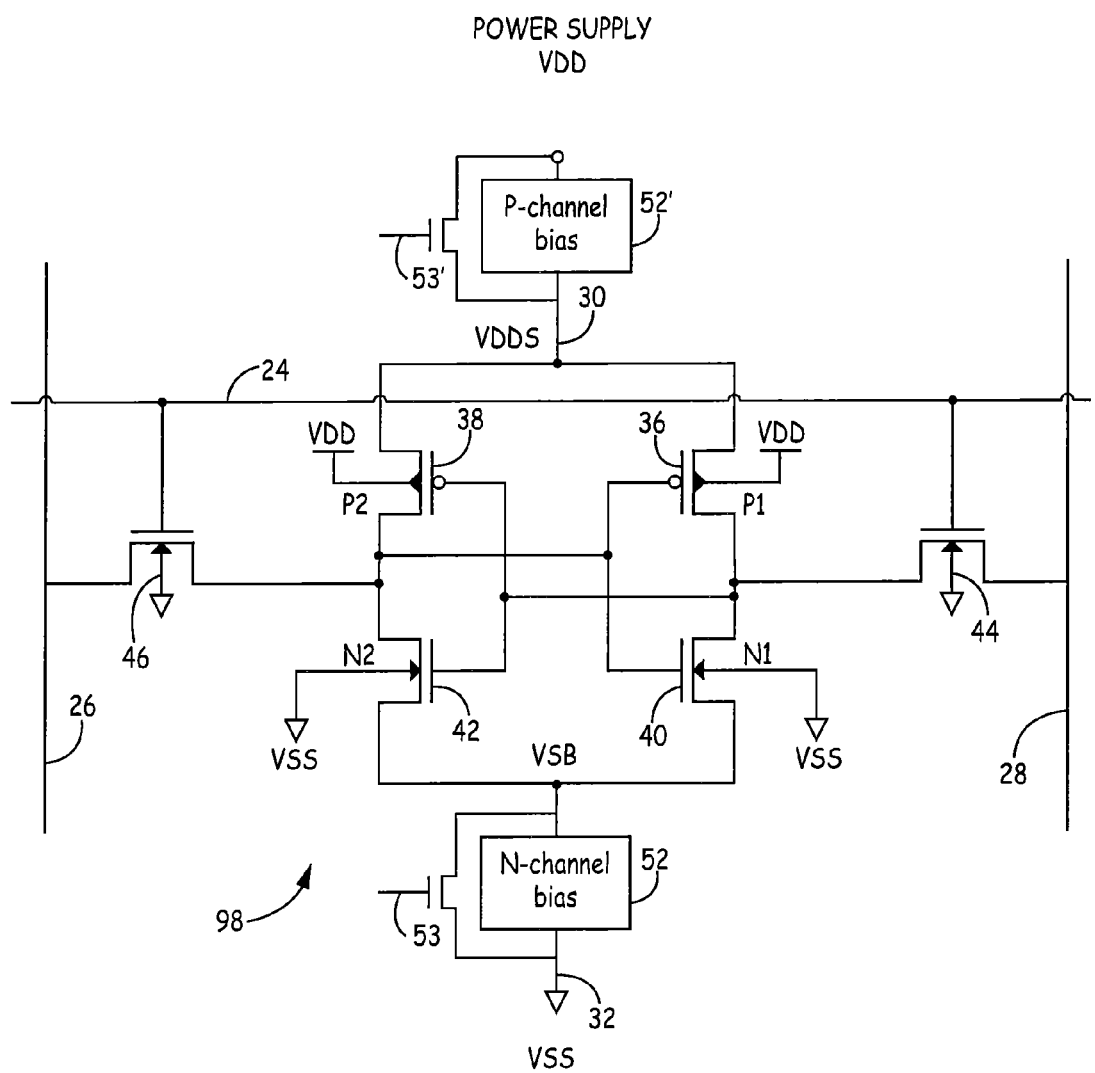
FIGS. 9a and 9b is a schematic of a SRAM cell with both P-channel and N-channel biases.
Figure 9B:
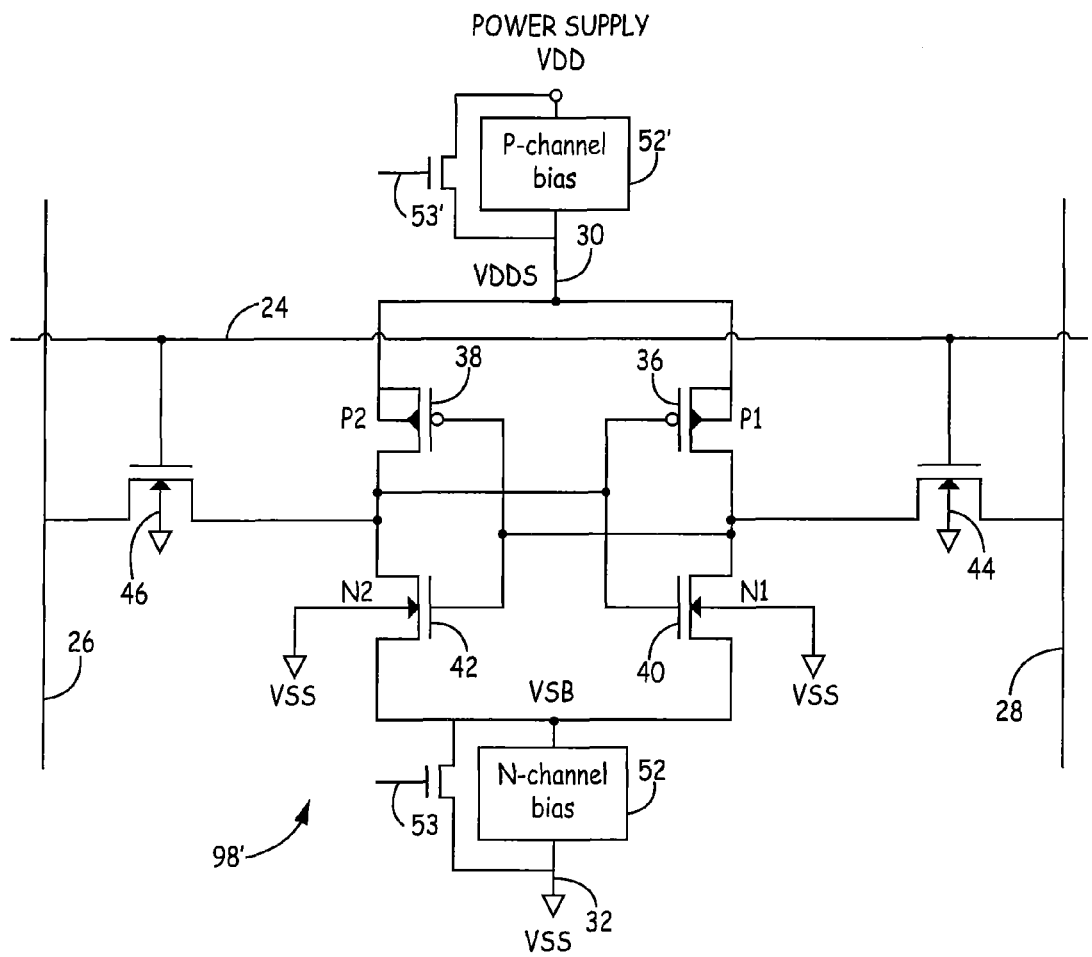

FIGS. 9a and 9b are SRAM cells 98 and 98', each of which bias both P-channel transistors 36, 38 and N-channel transistors 40, 42. In storage mode with switches 53 and 53' open, SRAM cell 98 incorporates N-channel source bias circuit 52 and P-channel supply bias circuit 52', with the bodies of transistors 36, 38, 40, 42 coupled to $V_{DD}$ and $V_{SS}$, as appropriate and indicated. SRAM cell 98' incorporates N-channel bias circuit 52 and P-channel bias circuit 52' with the bodies of transistors 36, 38, 40, 42 coupled to virtual supply $V_{DDS}$ and $V_{SB}$ as appropriate and indicated. While it is contemplated that either source bias circuit 52 or supply bias circuit 52' would be sufficient by itself to compensate for variations in threshold voltage and leakage current under most circumstances, incorporating both source bias circuit 52 and supply bias circuit 52' may provide benefits which cannot be provided by having only one source bias circuit 52 or supply bias circuit 52'. In read/write mode with switches 53 and 53', P-channel bias 52' and N-channel bias 52 are effectively removed from the circuit enabling uninhibited read/write functionality.

Figure 10A:
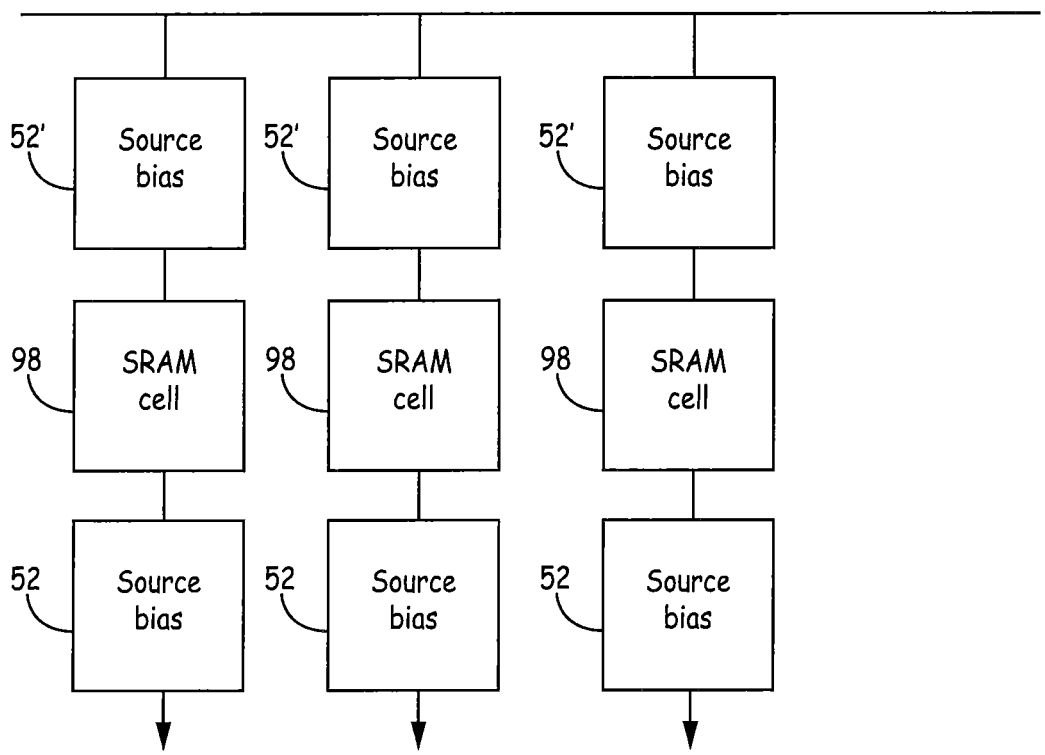
FIGS. 10a and 10b are block diagrams of implementations of an SRAM cell with both P-channel and N-channel biases.
Figure 10B:
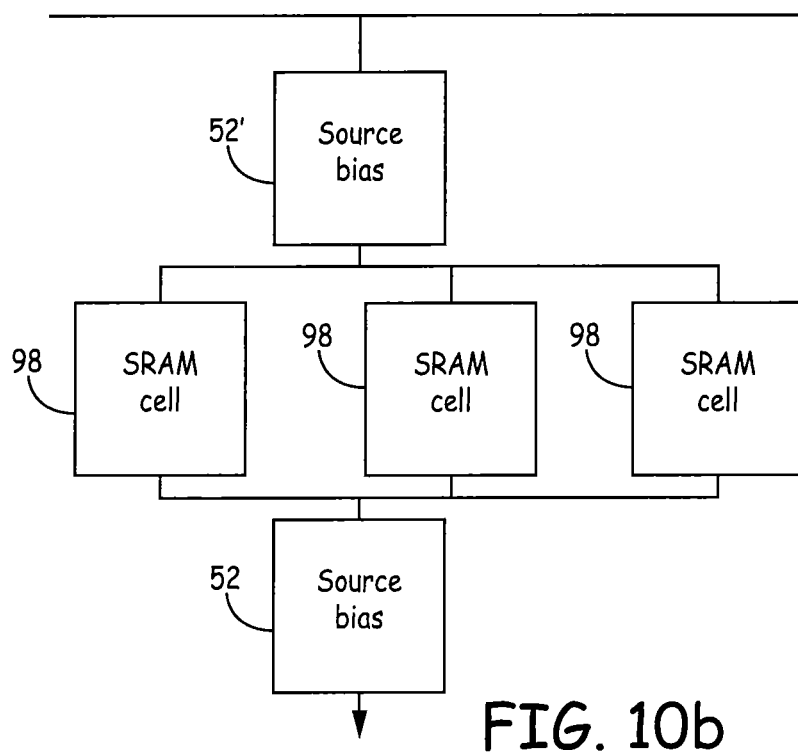

FIG. 10a is a block diagram of multiple SRAM cells 98 each being biased by one of multiple source biases 52 and one of multiple supply biases 52'. The block diagram of FIG. 10a applies equally well with respect to SRAM cells 98'. In an SRAM chip, the number of SRAM cells 98 may be scaled to provide a memory block adequate for whatever system in which the memory block is being utilized. In an alternative embodiment, illustrated in FIG. 10b, one source bias 52 and one supply bias 52' is adequate to bias multiple SRAM cells 98 or SRAM cells 98', as the case may be.

Figure 11:
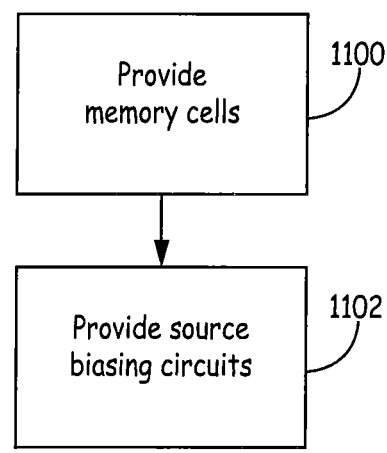
FIG. 11 is a flowchart for providing a random access memory with stable data retention properties.

FIG. 11 is a flowchart for maintaining a relatively stable source bias voltage of a random access memory over a range of temperatures. A plurality of SRAM cells 34, 34', 86, 86', 98, 98' are provided (1100). A plurality of N-channel bias circuits 52 or P-channel bias circuits 52' are provided (1102). In an embodiment, each bias circuit 52, 52' is coupled to one SRAM cell 34, 34', 86, 86', 98, 98'. In an alternative embodiment, each bias circuit is coupled to more than one SRAM cell 34, 34', 86, 86', 98, 98'. A bias voltage on each of memory cells 34, 34', 86, 86', 98, 98' thereby remains relatively stable over variations in temperature.

Thus, embodiments of the stable memory source bias over temperature and method are disclosed. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A random access memory, comprising:
   a plurality of memory cells, each of said plurality of memory cells having a memory element and a first electrical characteristic being variable based, at least in part, on temperature;
   a bias circuit operatively coupled to at least one of said plurality of memory cells, said bias circuit being configured to generate a bias voltage for said at least one of said plurality of memory cells said bias circuit having a second electrical characteristic being variable based, at least in part, on temperature; and
   a voltage buffer operatively coupled between said supply bias circuit and said at least one of said plurality of memory cells;

said bias circuit include at least one dummy memory cell to produce a voltage on an input of the voltage buffer;

said first electrical characteristic being proportional to said second electrical characteristic to automatically track proportionally over a predetermined range of temperatures, said predetermined range of temperatures being greater than zero;

said bias circuit being coupled with at least one of said plurality of memory cells so that said bias voltage on each of said plurality of memory cells is proportional with variations in said at least one of said plurality of memory cells over said predetermined range of temperatures.

2. The random access memory of claim 1 wherein said bias circuit is a source bias circuit.

3. The random access memory of claim 2 further comprising a supply bias circuit operatively coupled to said at least one of said plurality of memory cells, said supply bias circuit being configured to generate a bias voltage for at least one of said plurality of memory cells, said supply bias circuit having said second electrical characteristic being variable based, at least in part, on temperature.

4. The random access memory of claim 1 wherein said bias circuit is a supply bias circuit.

5. The random access memory of claim 4:
wherein said voltage buffer comprises the input and an output configured to supply said bias voltage, said input being coupled to said supply bias circuit and said output being coupled to said at least one of said plurality of memory cells; and
wherein another one of said plurality of memory cells is coupled to said input of said voltage buffer and configured to supply, in combination with said supply bias circuit, an input voltage related to said bias voltage to said input to said voltage buffer.

6. The random access memory of claim 1, further comprising a plurality of said bias circuits.

7. The random access memory of claim 6 wherein each of said plurality of bias circuits comprise a bias element with said bias element having said second electrical characteristic being variable based, at least in part, on temperature.

8. The random access memory of claim 6 wherein each one of said plurality of bias circuits corresponds to exactly one of said plurality of memory cells.

9. The random access memory of claim 6 wherein said bias element of each of said bias circuits comprise metal oxide semiconductor transistors.

10. The random access memory of claim 9 wherein said bias element of each of said plurality of bias circuits comprise P-channel metal oxide semiconductor transistors.

11. The random access memory of claim 10 wherein said random access memory is operatively coupled to a power source, wherein each memory element of said plurality of memory cells comprises a P-channel metal oxide semiconductor transistor having a body and wherein said body said P-channel metal oxide semiconductor transistor of at least one of said plurality of memory cells is operatively coupled to said power source.

12. The random access memory of claim 11 wherein said random access memory is operatively coupled to a reference ground, wherein each memory element of said plurality of memory cells comprises an N-channel metal oxide semiconductor transistor having a body and wherein said body of said N-channel metal oxide semiconductor transistor of said at least one of said plurality of memory cells is operatively coupled to said reference ground.

13. The random access memory of claim 10 wherein each memory element of said plurality of memory cells comprises a P-channel metal oxide semiconductor transistor having a body and wherein said body of said P-channel metal oxide semiconductor transistor of at least one of said plurality of memory cells is biased by said bias voltage of said bias element.

14. The random access memory of claim 13 wherein said random access memory is operatively coupled to a reference ground, wherein each memory element of said plurality of memory cells comprises an N-channel metal oxide semiconductor transistor having a body and wherein said body of said N-channel metal oxide semiconductor transistor of said at least one of said plurality of memory cells is operatively coupled to said reference ground.

15. The random access memory of claim 9 wherein said bias element of each of said plurality of bias circuits comprise N-channel metal oxide semiconductor transistors.

16. The random access memory of claim 15 wherein said random access memory is operatively coupled to a reference ground, wherein each memory element of said plurality of memory cells comprises an N-channel metal oxide semiconductor transistor having a body and wherein said body of said N-channel metal oxide semiconductor transistor of at least one of said plurality of memory cells is operatively coupled to said reference ground.

17. The random access memory of claim 15 wherein each memory element of said plurality of memory cells comprises an N-channel metal oxide semiconductor transistor having a body and wherein said body of said N-channel metal oxide semiconductor transistors of at least one of said plurality of memory cells is biased by said bias voltage of said bias element.

18. The random access memory of claim 6 wherein each of said plurality of bias circuits comprise a current mirror, said bias element being a component of said current mirror.

19. The random access memory of claim 18 wherein said memory element of each of said plurality of memory cells has a source node and a power node, said bias circuit being operatively coupled between said power node and a power source.

20. The random access memory of claim 19 wherein said bias circuit is a first bias circuit and wherein a second bias circuit is operatively coupled between said source node and a reference node.

21. The random access memory of claim 20 further comprising:
a supply bias voltage buffer operatively coupled between said first bias circuit and said supply node; and
a source bias voltage buffer operatively coupled between said second bias circuit and said source node.

22. The random access memory of claim 18 wherein said memory element of each of said plurality of memory cells has a source node and a power node, said power node being coupled to said power source and said bias circuit being operatively coupled between said source node and said reference node.

23. The random access memory of claim 22:
wherein said current mirror comprises said bias element and a current element operatively coupled to said bias element;
wherein a current source induces a current through said current element; and
whereby a bias current is induced through said bias element and said memory element is equivalent to said current and whereby said bias voltage on each source node of said plurality of memory cells is properly maintained.

24. The random access memory of claim 23 wherein each of said plurality of memory cells has a read mode and a storage mode, wherein said bias current is induced through said bias element when said memory cell is in said storage mode and wherein said bias current is not induced through said bias element when said memory cell is in said read mode.

25. The random access memory of claim 24 wherein each of said plurality of memory cells also has a write mode, wherein said bias current is not induced through said bias element when said memory cell is in said write mode.

26. The random access memory of claim 1 wherein said first electrical characteristic is a threshold voltage and wherein a current generated by said bias circuit induces said bias voltage based, at least in part, on said supply voltage and said threshold voltage.

27. The random access memory of claim 26 wherein said threshold voltage is inversely variable to variation in said temperature.

28. The random access memory of claim 26 wherein said bias voltage is based, at least in part, on said supply voltage less said threshold voltage less a voltage margin.

29. The random access memory of claim 26 wherein said bias voltage maintains said digital bit in at least one of said plurality of memory cells.

30. The random access memory of claim 1 wherein said bias circuit generates said bias voltage for more than one of said plurality of memory cells.

31. The random access memory of claim 30 wherein said bias circuit generates said bias voltage for all of said plurality of memory cells.

32. A method of maintaining a relatively stable bias voltage of a random access memory over a range of temperatures, comprising the steps of:
providing a plurality of memory cells each having a memory element, each of said plurality of memory cells being configured to store a digital bit and having a first electrical characteristic being variable based, at least in part, on temperature;
providing a bias circuit operatively coupled to at least one of said plurality of memory cells and being configured to bias said at least one of said plurality of memory cells; and
providing a voltage buffer operatively coupled between said supply bias circuit and said at least one of said plurality of memory cells;
said bias circuit include at least one dummy memory cell to produce a voltage on an input of the voltage buffer;
said bias circuit having a second electrical characteristic being variable based, at least in part, on temperature;
said first electrical characteristic being proportional to said second electrical characteristic to automatically track proportionally over a predetermined range of temperatures;
said bias circuit being coupled with at least one of said plurality of memory cells so that a bias voltage of at least one of said plurality of memory cells is proportional with variations in said at least one of said plurality of memory cells over said range of temperatures.

33. The method of claim 32 wherein said providing said bias circuit step comprises providing a source bias circuit.

34. The method of claim 33, further comprising the step of providing a supply bias circuit operatively coupled to said at least one of said plurality of memory cells, said supply bias circuit being configured to generate a bias voltage for at least one of said plurality of memory cells, said supply bias circuit having said second electrical characteristic being variable based, at least in part, on temperature.

35. The method of claim 32 wherein said bias circuit is a supply bias circuit.

36. The method of claim 35:
wherein said voltage buffer comprises the input and an output configured to supply said bias voltage, said input being coupled to said supply bias circuit and said output being coupled to said at least one of said plurality of memory cells; and
wherein another one of said plurality of memory cells is coupled to said input of said voltage buffer and configured to supply, in combination with said supply bias circuit, an input voltage related to said bias voltage to said input to said voltage buffer.

37. The method of claim 32 wherein said providing said bias circuit step provides said bias circuit operatively coupled to each of said plurality of memory cells.

38. The method of claim 32 wherein said bias voltage of each of said memory cells is proportional with variations over said range of temperatures.

39. The method of claim 32 wherein said plurality of bias circuits generates said bias voltage of at least one of said plurality of memory cells.

40. The method of claim 39 wherein said plurality of bias circuits generates said bias voltage of each of said plurality of memory cells.

41. The method of claim 32 wherein said providing said bias circuit provides a plurality of bias circuits operatively coupled to at least one of said plurality of memory cells.

42. The method of claim 41 wherein at least one of said plurality of bias circuits being configured to bias at least said at least one of said plurality of memory cells, each of said plurality of bias circuits having a second electrical characteristic being variable based, at least in part, on temperature.

43. The method of claim 42 wherein said random access memory is operatively coupled to a power source, wherein each memory element of said plurality of memory cells comprises a P-channel metal oxide semiconductor transistor having a body and wherein said body said P-channel metal oxide semiconductor transistor of at least one of said plurality of memory cells is operatively coupled to said power source.

44. The method of claim 43 wherein said random access memory is operatively coupled to a reference ground, wherein each memory element of said plurality of memory cells comprises an N-channel metal oxide semiconductor transistor having a body and wherein said body of said N-channel metal oxide semiconductor transistor of said at least one of said plurality of memory cells is operatively coupled to said reference ground.

45. The method of claim 42 wherein each memory element of said plurality of memory cells comprises a P-channel metal oxide semiconductor transistor having a body and wherein said body of said P-channel metal oxide semiconductor transistor of at least one of said plurality of memory cells is biased by said bias voltage of said bias element.

46. The method of claim 45 wherein said random access memory is operatively coupled to a reference ground, wherein each memory element of said plurality of memory cells comprises an N-channel metal oxide semiconductor transistor having a body and wherein said body of said N-channel metal oxide semiconductor transistor of said at least one of said plurality of memory cells is operatively coupled to said reference ground.

47. The method of claim 41 wherein said providing said plurality of bias circuits step provides said plurality of bias circuits operatively coupled to each of said plurality of memory cells, at least one of said plurality of bias circuits being configured to bias of each respective one of said plurality of memory cells.

48. The method of claim 47 wherein said random access memory is operatively coupled to a reference ground, wherein each memory element of said plurality of memory cells comprises an N-channel metal oxide semiconductor transistor having a body and wherein said body of said N-channel metal oxide semiconductor transistor of at least one of said plurality of memory cells is operatively coupled to said reference ground.

49. The method of claim 47 wherein each memory element of said plurality of memory cells comprises an N-channel metal oxide semiconductor transistor having a body and wherein said body of said N-channel metal oxide semiconductor transistors of at least one of said plurality of memory cells is biased by said bias voltage of said bias element.

50. The method of claim 41 wherein said plurality of bias circuits generates said bias voltage of at least one of said plurality of memory cells.

51. The method of claim 50 wherein said plurality of bias circuits generates said bias voltage of each of said plurality of memory cells.

52. The method of claim 41:
wherein said providing said plurality of memory cells provides each of said plurality of memory cells having said memory element with a source node and a power node, said power node being coupled to a power source configured to generate a supply voltage; and
wherein said providing said bias circuit provides said bias circuit operatively coupled between said power node of each of said plurality of memory cells and said power source, each of said bias circuits being configured to generate a bias current through said power node of each respective one of said plurality of memory cells;
whereby said bias voltage on each power node of said plurality of memory cells is relatively stable over variations in temperature.

53. The method of claim 52 wherein said providing said bias circuit provides said bias circuit operatively coupled between said source node and said reference node, whereby said bias voltage on each power node of said plurality of memory cells is relatively stable over variations in temperature.

54. The method of claim 53, further comprising:
a supply bias voltage buffer operatively coupled between said first bias circuit and said supply node; and a source bias voltage buffer operatively coupled between said second bias circuit and said source node.

55. The method of claim 41:
wherein said providing said plurality of memory cells provides each of said plurality of memory cells having said memory element with a source node and a power node, said power node being coupled to a power source configured to generate a supply voltage; and
wherein said providing said bias circuit provides said bias circuit operatively coupled between said source node of each of said plurality of memory cells and a reference node, each of said bias circuits being configured to generate a bias current through said source node of each respective one of said plurality of memory cells;
whereby said bias voltage on each source node of said plurality of memory cells is relatively stable over variations in temperature.

56. The method of claim 55 wherein each of said plurality of bias circuits comprise a bias element with said bias element having said second electrical characteristic being variable based, at least in part, on temperature.

57. The method of claim 56 wherein said bias element of each of said bias circuits comprise metal oxide semiconductor transistors.

58. The method of claim 57 wherein said bias element of each of said plurality of bias circuits comprise P-channel metal oxide semiconductor transistors.

59. The method of claim 57 wherein said bias element of each of said plurality of bias circuits comprise N-channel metal oxide semiconductor transistors.

60. The method of claim 56 wherein each of said plurality bias circuits comprise a current mirror, said bias element being a component of said current mirror.

61. The method of claim 60:
wherein said current mirror comprises said bias element and a current element operatively coupled to said bias element;
wherein a current source induces a current through said current element; and whereby a bias current is induced through said bias element equivalent to said current and said bias voltage on each source node of said plurality of memory cells is properly maintained.

62. The method of claim 61 wherein each of said plurality of memory cells has a read mode and a storage mode, wherein said bias current is induced through said bias element when said memory cell is in said storage mode and wherein said bias current is not induced through said bias element when said memory cell is in said read mode.

63. The method of claim 62 wherein each of said plurality of memory cells also has a write mode and wherein said bias current is not induced through said bias element when said memory cell is in said write mode.

64. The method of claim 55 wherein said first electrical characteristic is a threshold voltage and wherein bias current induces said bias voltage based, at least in part, on said supply voltage and said threshold voltage.

65. The method of claim 64 wherein said threshold voltage is inversely variable to variation in said temperature.

66. The method of claim 64 wherein said bias voltage is based, at least in part, on said supply voltage less said threshold voltage less a voltage margin.

67. The method of claim 64 wherein said bias voltage maintains said digital bit in at least one of said plurality of memory cells.

* * * * *